(12) United States Patent
Chao

(10) Patent No.: US 11,450,656 B2
(45) Date of Patent: Sep. 20, 2022

(54) ANTI-PARALLEL DIODE DEVICE

(71) Applicant: RichWave Technology Corp., Taipei (TW)

(72) Inventor: Chuan-Chen Chao, Taipei (TW)

(73) Assignee: RichWave Technology Corp., Taipei (TW)

(*) Notice: Subject to any disclaimer, the term of this patent is extended or adjusted under 35 U.S.C. 154(b) by 0 days.

(21) Appl. No.: 16/522,677

(22) Filed: Jul. 26, 2019

(65) Prior Publication Data
US 2020/0043911 A1    Feb. 6, 2020

(30) Foreign Application Priority Data
Jul. 31, 2018    (TW) ................... 107126456

(51) Int. Cl.
*H01L 27/02* (2006.01)
*H02H 9/04* (2006.01)

(52) U.S. Cl.
CPC ...... *H01L 27/0255* (2013.01); *H01L 27/0259* (2013.01); *H02H 9/046* (2013.01)

(58) Field of Classification Search
CPC .. H01L 27/0255; H01L 27/0259; H02H 9/046
See application file for complete search history.

(56) References Cited

U.S. PATENT DOCUMENTS

| | | | |
|---|---|---|---|
| 7,285,801 B2 | 10/2007 | Eliashevich et al. | |
| 2004/0012958 A1* | 1/2004 | Hashimoto | H01L 33/60 362/241 |
| 2005/0167680 A1* | 8/2005 | Shei | H01L 25/167 257/79 |
| 2005/0225973 A1* | 10/2005 | Eliashevich | H01L 27/153 362/217.1 |
| 2014/0011344 A1 | 1/2014 | Lamey et al. | |
| 2017/0125398 A1* | 5/2017 | Nomura | H01L 29/866 |
| 2017/0141099 A1* | 5/2017 | Uno | H01L 27/0814 |

FOREIGN PATENT DOCUMENTS

| | | |
|---|---|---|
| CN | 107910858 | 4/2018 |
| TW | 511270 | 11/2002 |
| TW | 201613064 | 4/2016 |

OTHER PUBLICATIONS

"Office Action of Taiwan Counterpart Application", dated Apr. 15, 2021, p. 1-p. 8.
"Office Action of Taiwan Counterpart Application", dated Aug. 30, 2021, p. 1-p. 9.

* cited by examiner

*Primary Examiner* — Su C Kim
(74) *Attorney, Agent, or Firm* — JCIPRNET

(57) ABSTRACT

An anti-parallel diode device includes a first semiconductor, a second semiconductor, a third semiconductor, and a third diode. The first semiconductor is of a first conductivity type, and the second semiconductor and the third semiconductor are of a second conductivity type. The second semiconductor is in contact with the first semiconductor, so that the first semiconductor and the second semiconductor form a first diode. The third semiconductor is in contact with the first semiconductor, so that the first semiconductor and the third semiconductor form a second diode. A first terminal of the third diode is electrically connected to the first semiconductor. The first terminal of the third diode is of the second conductivity type.

20 Claims, 12 Drawing Sheets

ANTI-PARALLEL DIODE DEVICE

CROSS-REFERENCE TO RELATED APPLICATION

This application claims the priority benefit of Taiwan application serial no. 107126456, filed on Jul. 31, 2018. The entirety of the above-mentioned patent application is hereby incorporated by reference herein and made a part of this specification.

BACKGROUND

Technical Field

This invention relates to a voltage clamping device, and more particularly to an anti-parallel diode device.

Description of Related Art

FIG. 1 is a schematic circuit diagram of an anti-parallel diode device 200. The anti-parallel diode device 200 includes diodes 207-212. The anti-parallel diode device 200 may be used for an electrostatic discharge (ESD) protection circuit, a voltage divider circuit, and a voltage clamper of an integrated circuit (IC), etc. Taking ESD protection circuit of an IC as an example, a cathode of diode 207 and an anode of diode 210 may be coupled to a solder pad 205 of the IC, and a cathode of diode 212 and an anode of diode 209 may be coupled to a reference voltage 206 of the IC. The anti-parallel diode device 200 may perform a voltage clamping function or ESD protection on pad 205.

Pad 205 may transmit signals under normal operating conditions in which no static electricity is generated. When a signal voltage level of pad 205 is higher than a voltage level of reference voltage 206, the voltage difference between pad 205 and reference voltage 206 should be less than a sum of forward turn-on voltages of diodes 210-212. When the signal voltage level of pad 205 is lower than the voltage level of reference voltage 206, the voltage difference between pad 205 and reference voltage 206 should be less than a sum of forward turn-on voltages of diodes 207-209. Therefore, the anti-parallel diode device 200 does not affect a normal operation of the IC.

When an electrostatic pulse is generated on pad 205, if the electrostatic pulse is positive, an ESD current may flow from pad 205 to reference voltage 206 through diodes 210, 211, and 212. If the electrostatic pulse is negative, a negative ESD current may flow from pad 205 to reference voltage 206 via diodes 207, 208, and 209.

When positive ESD occurs, diodes 210-212 are forwardly turned on, diodes 207-209 are in reverse-bias states, and voltages at nodes between two adjacent diodes may be uncertain. That is, the voltages across diodes 207, 208, and 209 may be unbalanced (or unequal). In this situation, a diode which is having a higher cross-voltage (i.e., a voltage greater than a breakdown voltage) may cause breakdown and damages. On the contrary, when negative ESD occurs, diodes 207-209 are forwardly turned on, diodes 210-212 are in reverse-bias states. The unbalanced cross-voltage problems of diodes 210-212 may be analogized with reference to explanation of diodes 207-209, and therefore will not be described hereinafter.

SUMMARY

An embodiment of the invention provides an anti-parallel diode device. The anti-parallel diode device includes a first semiconductor, a second semiconductor, a third semiconductor, and a third diode. The first semiconductor is of a first conductivity type, and the second semiconductor and the third semiconductor are of a second conductivity type. The second semiconductor is in contact with the first semiconductor, so that the first semiconductor and the second semiconductor form a first diode. The third semiconductor is in contact with the first semiconductor, so that the first semiconductor and the third semiconductor form a second diode. A first terminal of the third diode is electrically connected to the first semiconductor. The first terminal of the third diode is of the second conductivity type.

In order to make the above-described features of the invention more comprehensible, the following detailed description of the embodiments will be described in detail below.

DETAILED DESCRIPTION OF EMBODIMENTS

Figure 1:
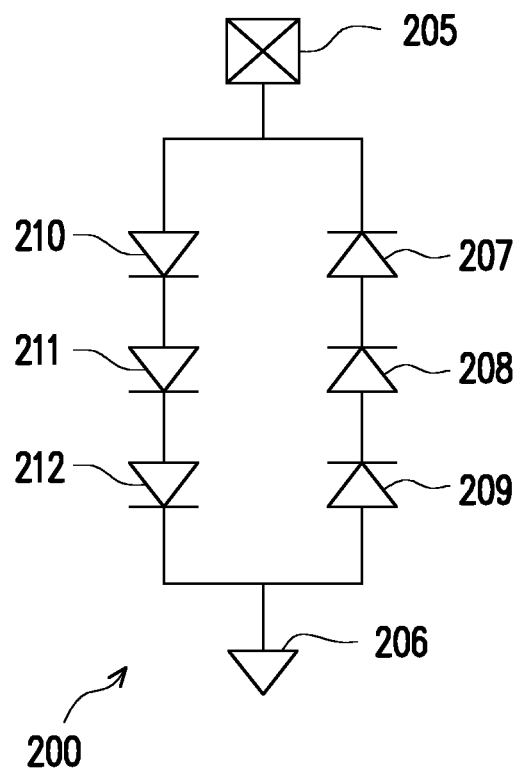
FIG. 1 is a schematic circuit diagram of an anti-parallel diode device.

The term "coupled (or connected)" as used throughout the specification (including claims) may refer to any direct or indirect connection. For instance, if the first device is described as being coupled (or connected) to the second device, it should be construed that the first device may be directly connected to the second device, or the first device may be indirectly connected to the second device through other devices or other connection means. Besides, wherever possible, the elements/components/steps indicated by the same reference numbers in the drawings and the embodiments are identical or similar elements/components/steps. Descriptions of elements/components/steps indicated by the same reference numbers in different embodiments may be cross-referenced.

The following embodiments of the invention provide anti-parallel diode devices that may minimize the effect of unbalancing voltage across the diodes in the anti-parallel diode devices.

Figure 2:
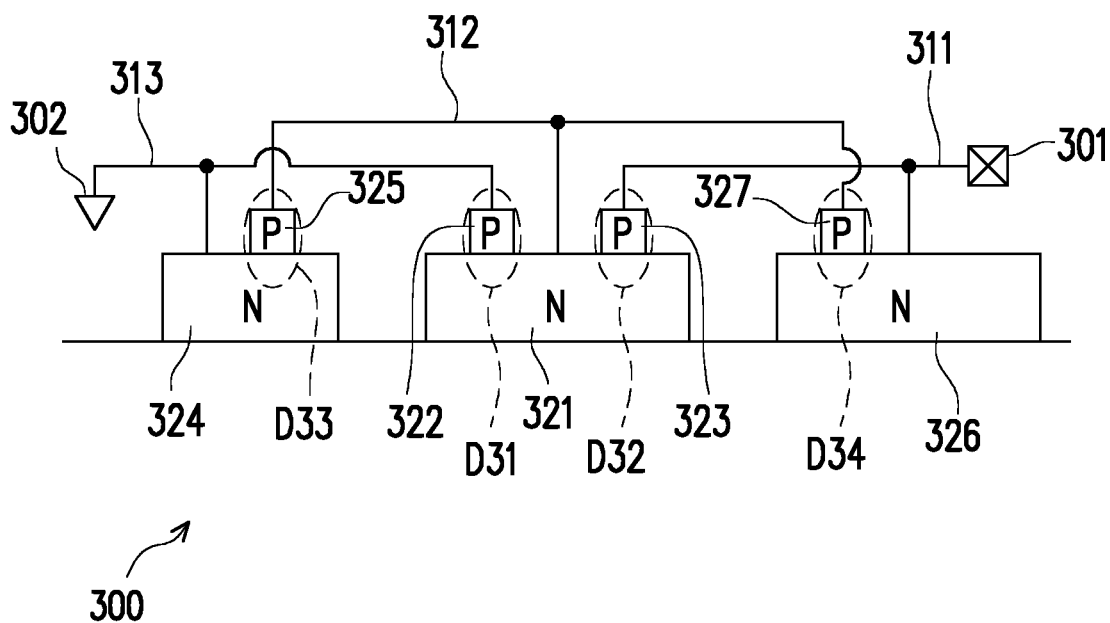
FIG. 2 is a schematic view showing a layout of an anti-parallel diode device according to a first embodiment of the invention.

FIG. 2 is a schematic view showing a layout of an anti-parallel diode device 300 according to a first embodiment of the invention. The layout shown in FIG. 2 is a cross-sectional view. This anti-parallel diode device 300 includes semiconductors 321-327. Semiconductors 321, 324, and 326 are of a first conductivity type (e.g., N-type), and semiconductors 322, 323, 325, and 327 are of a second conductivity type (e.g., P-type). In other embodiments, the first conductivity type may be a P-type, and the second conductivity type may be an N-type.

Figure 3:
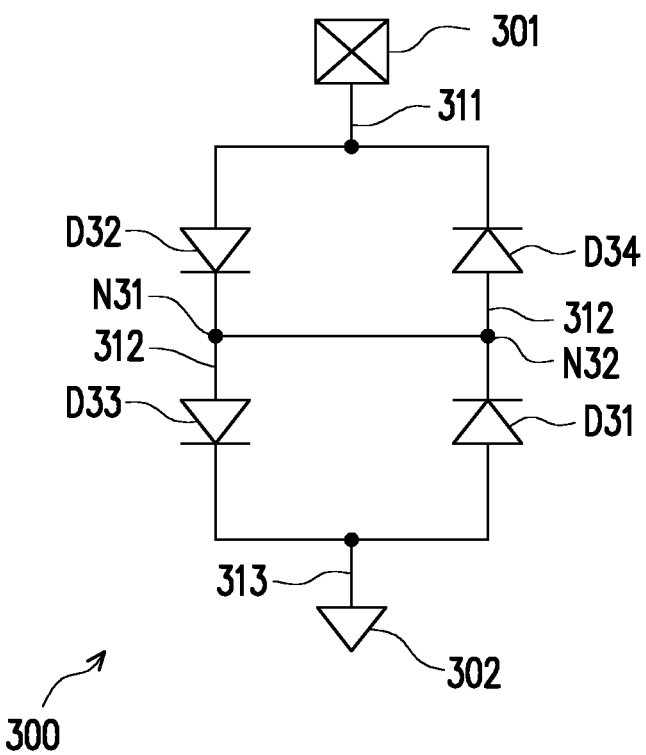
FIG. 3 is a schematic view showing an equivalent circuit of the anti-parallel diode device depicted in FIG. 2 according to an embodiment of the invention.

FIG. 3 is a schematic view showing an equivalent circuit of the anti-parallel diode device 300 depicted in FIG. 2 according to an embodiment of the invention. Please refer to FIG. 2 and FIG. 3. Semiconductors 322 and 323 are in contact with semiconductor 321 to form a diode D31 and a diode D32, respectively. Semiconductors 322, 323, 325, and 327 may be a base layer of transistor structure and semiconductors 321, 324, and 326 may be a collector layer of transistor structure. Semiconductors 322 and 323 are both disposed on a same surface of semiconductor 321, as shown in FIG. 2. Since diodes D31 and D32 share the same semiconductor 321, an area consumption in the IC may be reduced.

Semiconductor 325 is in contact with semiconductor 324 to form a diode D33. A first terminal (e.g., an anode, i.e., semiconductor 325) of diode D33 is electrically connected to semiconductor 321 (second terminals of diodes D31-D32) via a connection wire 312. Diodes D32-D33 form a diode string. A second terminal of diode D33 (e.g., a cathode, i.e., semiconductor 324) is electrically connected to a first terminal (e.g., an anode, i.e., semiconductor 322) of diode D31 via wire 313. Semiconductor 327 is in contact with semiconductor 326 to form a diode D34. A first terminal (e.g., an anode, i.e., semiconductor 327) of diode D34 is electrically connected to semiconductor 321 (second terminals of diodes D31-D32) via wire 312. Diodes D34 and D31 form another diode string. A second terminal of diode D34 (e.g., a cathode, i.e., semiconductor 326) is electrically connected to a first terminal (e.g., an anode, i.e., semiconductor 323) of diode D32 via wire 311. Further, as shown in FIG. 2, semiconductors 322-323 disposed on a same surface of semiconductor 321 may be isolated from each other and may not be in contact with each other, and semiconductors 321, 324, and 326 disposed on a same surface of a substrate may also be isolated from each other and may not be in contact with each other.

The anti-parallel diode device 300 may be used for ESD protection circuits, voltage dividers and voltage clampers of IC, etc. Taking ESD protection of the IC as an example, the cathode (semiconductor 326) of diode D34 and the anode (semiconductor 323) of diode D32 may be electrically connected to pad 301 of the IC via wire 311. The cathode (semiconductor 324) of diode D33 and the anode (semiconductor 322) of diode D31 may be electrically connected to reference voltage 302 of the IC via wire 313.

Pad 301 may transmit signals under normal operating conditions in which no static electricity is generated. When a signal voltage level of pad 301 is higher than a voltage level of reference voltage 302, a voltage difference between pad 301 and reference voltage 302 should be less than a sum of forward turn-on voltages of diodes D32 and D33. When the signal voltage level of pad 301 is lower than the voltage level of reference voltage 302, the voltage difference between pad 301 and reference voltage 302 should be less than a sum of forward turn-on voltages of diodes D31 and D34. Therefore, the anti-parallel diode device 300 does not affect a normal operation of the IC.

When an electrostatic pulse is generated on pad 301, if the electrostatic pulse is positive, an ESD current may flow from pad 301 to reference voltage 302 through wire 311, diode D32, wire 312, diode D33, and wire 313. If the electrostatic pulse is negative, a negative ESD current may flow from pad 301 to reference voltage 302 via wire 311, diode D34, wire 312, diode D31, and wire 313.

When ESD causes diodes D32-D33 to be forwardly turned on, diodes D34 and D31 are in reverse-bias states. At this time, node N31 may provide a dividing-voltage potential to node N32 through the common semiconductor 321 of diodes D31-D32 and wire 312. Therefore, the anti-parallel diode device 300 may minimize the effect of unbalancing voltages across diodes D34 and D31 to avoid damages of diodes D34 and D31. On the contrary, an unbalanced cross-voltage problem of diodes D32-D33 when the diodes are in reverse-bias states may be analogized with reference to the relevant descriptions of diodes D34 and D31 and therefore will not be described again.

Figure 4:
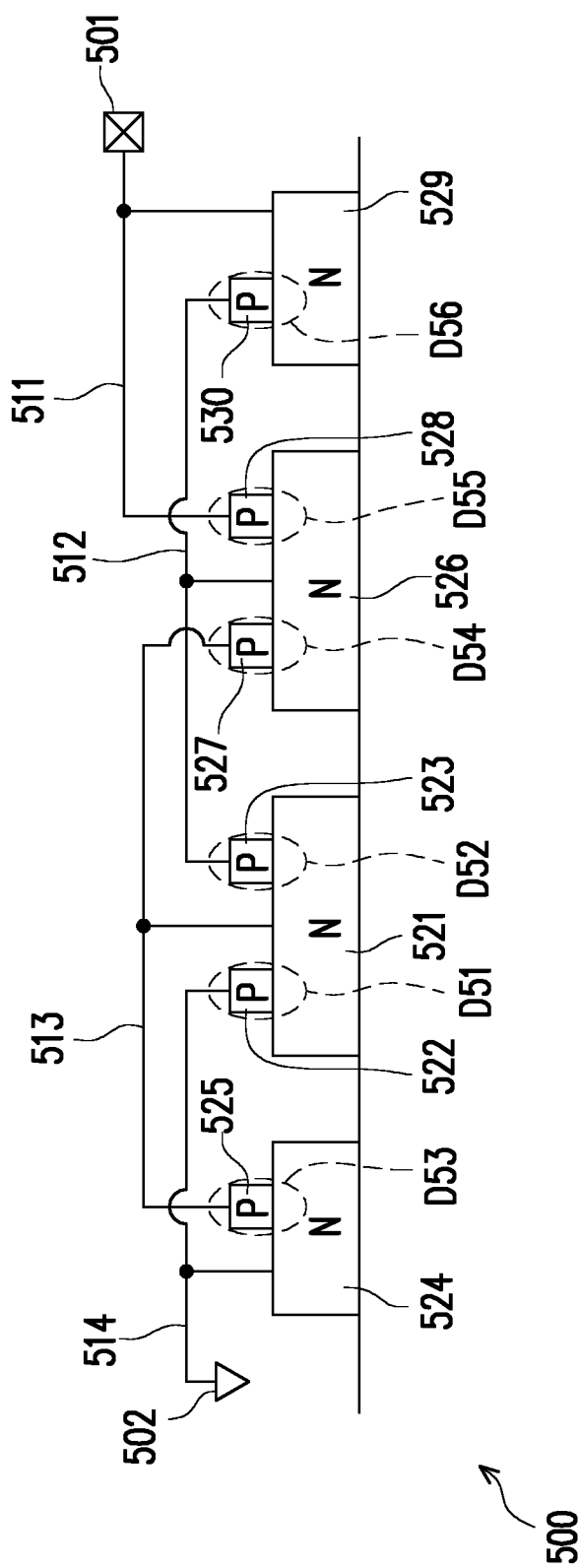
FIG. 4 is a schematic view showing a layout of an anti-parallel diode device according to a second embodiment of the invention.

FIG. 4 is a schematic view showing a layout of an anti-parallel diode device 500 according to a second embodiment of the invention. The layout shown in FIG. 4 is a cross-sectional view. The anti-parallel diode device 500 includes semiconductors 521-530. Semiconductors 521, 524, 526, and 529 are of a first conductivity type (for example, an N-type, which may be a collector layer of a transistor), and semiconductors 522, 523, 525, 527, 528, and 530 are of a second conductivity type (for example, a P-type, which may be a base layer of the transistor). In other embodiments, the first conductivity type may be a P-type and the second conductivity type may be an N-type.

Figure 5:
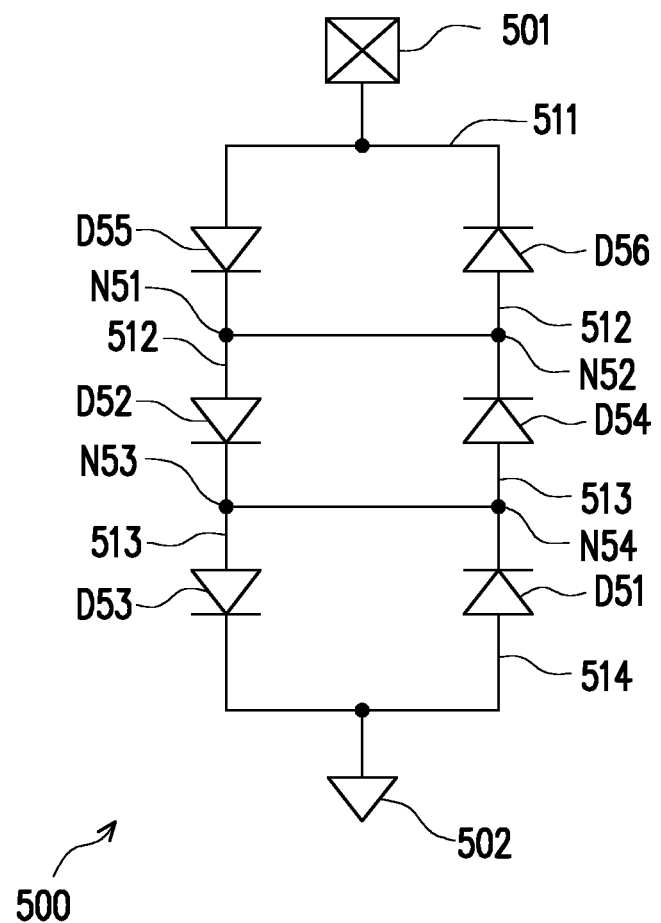
FIG. 5 is a schematic view showing an equivalent circuit of the anti-parallel diode device depicted in FIG. 4 according to an embodiment of the invention.

FIG. 5 is a schematic view showing an equivalent circuit of the anti-parallel diode device 500 depicted in FIG. 4 according to an embodiment of the invention. Please refer to FIG. 4 and FIG. 5. Semiconductor 522 and 523 are in contact with semiconductor 521 to form diodes D51 and D52, respectively. Semiconductors 522 and 523 are both disposed on a same surface of semiconductor 521 as shown in FIG. 4. Since diodes D51 and D52 share the same semiconductor 521, an area consumption in the IC may be reduced.

Semiconductor 525 is in contact with semiconductor 524 to form diode D53. A first terminal (e.g., an anode, i.e., semiconductor 525) of diode D53 is electrically connected to semiconductor 521 (second terminals of diodes D51-D52) via wire 513. A second terminal of diode D53 (e.g., a cathode, i.e., semiconductor 524) is electrically connected to a first terminal (e.g., an anode, i.e., semiconductor 522) of diode D51 via wire 514.

Semiconductor 526 is electrically connected to semiconductor 523 via wire 512. Semiconductors 527 and 528 are in contact with semiconductor 526 to form diodes D54 and D55, respectively. Semiconductor 527 is electrically connected to semiconductor 521 via wire 513. Diodes D55, D52, and D53 form a diode string. Semiconductors 527 and 528 are both disposed on a same surface of semiconductor 526, as shown in FIG. 4. Since diodes D54-D55 share the same semiconductor 526, an area consumption in the IC may be reduced.

Semiconductor 530 is in contact with semiconductor 529 to form diode D56. A first terminal (e.g., an anode, i.e., semiconductor 530) of diode D56 is electrically connected to semiconductor 526 (second terminals of diodes D54-D55) via wire 512. Diodes D56, D54, and D51 form another diode string. A second terminal of diode D56 (e.g., a cathode, i.e., semiconductor 529) is electrically connected to a first terminal (e.g., an anode, i.e., semiconductor 528) of diode D55 via wire 511. Further, as shown in FIG. 4, semiconductors 522-523 disposed on a same surface of semiconductor 521 may be isolated from each other and may not be in contact with each other, semiconductors 527-528 disposed on a same surface of semiconductor 526 may be isolated from each other and may not be in contact with each other, and semiconductors 521, 524, 526, and 529 disposed on a same surface of a substrate may be isolated from each other and may not be in contact with each other.

The anti-parallel diode device 500 may be used for ESD protection circuits, voltage dividers, and voltage clampers of the IC, etc. Taking ESD protection of the IC as an example, the cathode (semiconductor 529) of diode D56 and the anode (semiconductor 528) of diode D55 may be electrically connected to pad 501 of the IC via wire 511. The cathode (semiconductor 524) of diode D53 and the anode (semiconductor 522) of diode D51 may be electrically connected to reference voltage 502 of the IC via wire 514.

Pad 501 may transmit signals under normal operating conditions in which no static electricity is generated. When a signal voltage level of pad 501 is higher than a voltage level of reference voltage 502, a voltage difference between pad 501 and reference voltage 502 should be less than a sum of forward turn-on voltages of diodes D55, D52, and D53. When the signal voltage level of pad 501 is lower than the voltage level of reference voltage 502, the voltage difference between pad 501 and reference voltage 502 should be less than a sum of forward turn-on voltages of diodes D56, D54, and D51. Therefore, the anti-parallel diode device 500 does not affect a normal operation of the IC.

When an electrostatic pulse is generated on pad 501, if the electrostatic pulse is positive, an ESD current may flow from pad 501 to reference voltage 502 through wire 511, diode D55, wire 512, diode D52, wire 513, diode D53, and wire 514. If the electrostatic pulse is negative, a negative ESD current may flow from pad 501 to reference voltage 502 via wire 511, diode D56, wire 512, diode D54, wire 513, diode D51, and wire 514.

When ESD causes diodes D55, D52, and D53 to be forwardly turned on, diodes D56, D54, and D51 are in reverse-bias states. Node N51 may provide a dividing-voltage potential to node N52 through the common semiconductor 526 of diodes D54-D55 and wire 512, and node N53 may provide a dividing-voltage potential to node N54 through the common semiconductor 521 of diodes D51-D52 and wire 513. Therefore, the anti-parallel diode device 500 may minimize the effect of unbalancing reverse-bias across diodes D56, D54, and D51 to avoid damages to the diodes. On the contrary, an unbalanced cross-voltage problem of diodes D55, D52, and D53 in reverse-bias states may be analogized with reference to the relevant descriptions of diodes D56, D54, and D51 and therefore will not be described again.

Compared to the anti-parallel diode device 300 of the first embodiment, the anti-parallel diode device 500 may provide a wider range of normal operating signal, more divided output voltages, or a higher clamping voltage.

Figure 6:
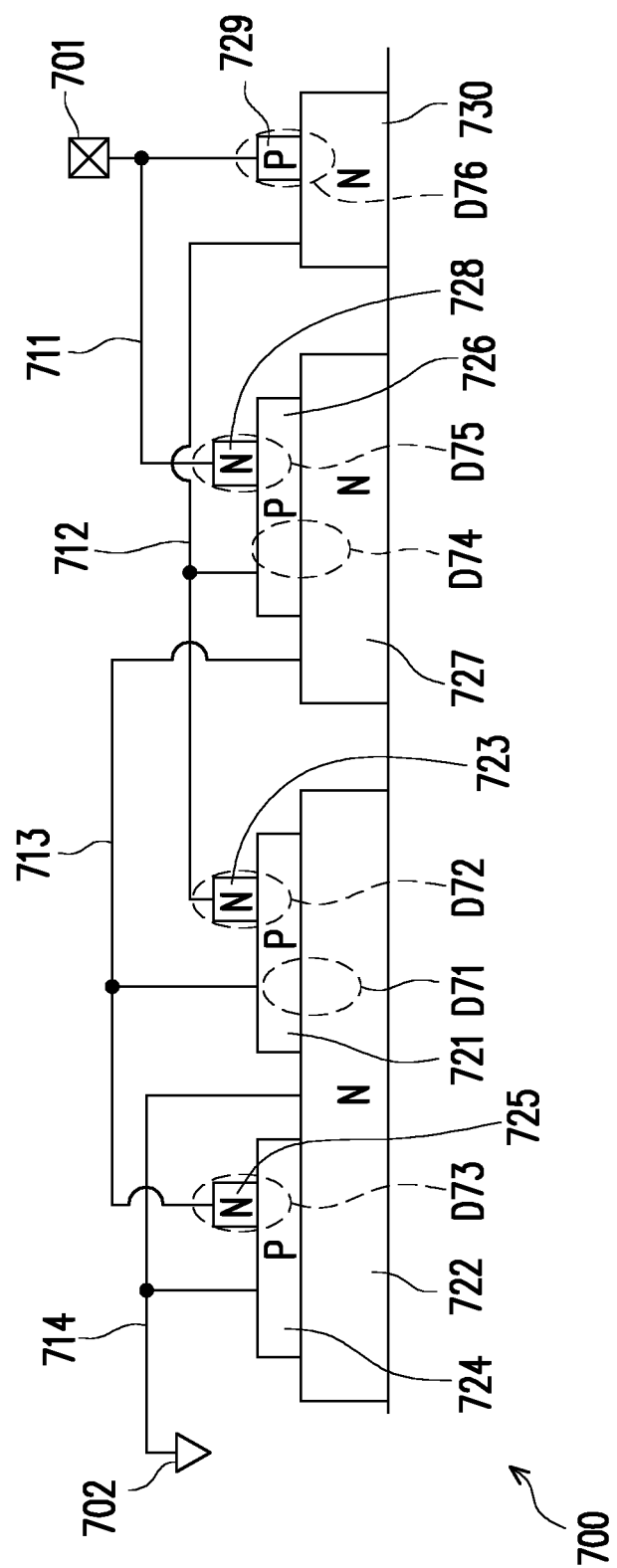
FIG. 6 is a schematic view showing a layout of an anti-parallel diode device according to a third embodiment of the invention.

FIG. 6 is a schematic view showing a layout of an anti-parallel diode device 700 according to a third embodiment of the invention. The layout shown in FIG. 6 is a cross-sectional view. The anti-parallel diode device 700 includes semiconductors 721-730. In the embodiment shown in FIG. 6, semiconductors 721, 724, 726, and 729 are of a first conductivity type (e.g., a P-type, which may be a base layer of a transistor), semiconductors 722, 727, and 730 are of a second conductivity type (e.g., an N-type, which may be a collector layer of a transistor), and semiconductors 723, 725, and 728 are also of the second conductivity type (e.g., the N-type, which may be an emitter layer of a transistor). In other embodiments, the first conductivity type may be an N-type, and the second conductivity type may be a P-type.

Figure 7:
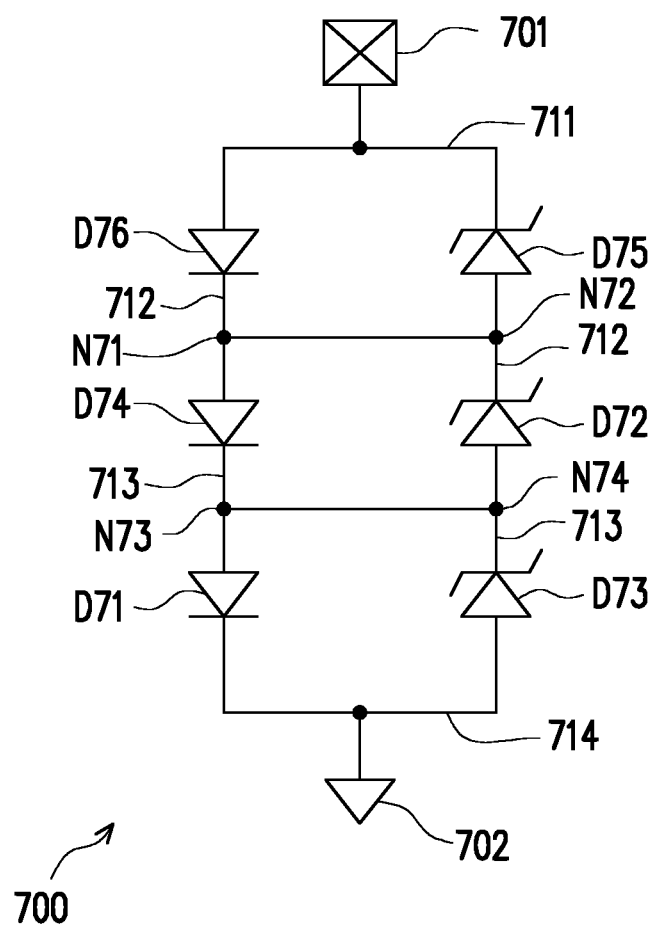
FIG. 7 is a schematic view showing an equivalent circuit of the anti-parallel diode device depicted in FIG. 6 according to an embodiment of the invention.

FIG. 7 is a schematic view showing an equivalent circuit of the anti-parallel diode device 700 depicted in FIG. 6 according to an embodiment of the invention. Please refer to FIG. 6 and FIG. 7. Semiconductors 722-723 are in contact with semiconductor 721 to form diodes D71 and D72, respectively. Semiconductor 721 is disposed between semiconductors 722 and 723 as shown in FIG. 6. Since diodes D71 and D72 share the same semiconductor 721, an area consumption in the IC may be reduced.

In the embodiment shown in FIG. 6, semiconductor 724 is placed on semiconductor 722. Semiconductor 725 is in contact with semiconductor 724 to form diode D73. A first terminal of diode D73 (e.g., a cathode, i.e., semiconductor 725) is electrically connected to semiconductor 721 (second terminals of diodes D71-D72) via wire 713. A second terminal of diode D73 (e.g., an anode, i.e., semiconductor 724) is electrically connected to a first terminal (e.g., a cathode, i.e., semiconductor 722) of diode D71 via wire 714.

Semiconductor 726 is disposed between semiconductors 727 and 728 as shown in FIG. 6. Semiconductors 726, 727, and 728 may serve as a base, a collector, and an emitter of a transistor, respectively. Semiconductor 726 is electrically connected to semiconductor 723 via wire 712. Semiconductors 727-728 are in contact with semiconductor 726 to form diodes D74-D75, respectively. Semiconductor 727 is electrically connected to semiconductor 721 via wire 713. Diodes D75, D72, and D73 form a diode string. Since diodes D74 and D75 share the same semiconductor 726, an area consumption in the IC may be reduced.

Semiconductor 730 is in contact with semiconductor 729 to form diode D76. A first terminal of diode D76 (e.g., a cathode, i.e., semiconductor 730) is electrically connected to semiconductor 726 (second terminals of diodes D74-D75) via wire 712. Diodes D76, D74, and D71 form another diode string. A second terminal of diode D76 (e.g., an anode, i.e., semiconductor 729) is electrically connected to a first terminal of diode D75 (e.g., a cathode, i.e., semiconductor 728) via wire 711. Further, as shown in FIG. 6, semiconductors 721 and 724 disposed on a same surface of semiconductor 722 may be isolated from each other and may not be in contact with each other, and semiconductors 722, 727, and 730 disposed on a same surface of a substrate may be isolated from each other and may not be in contact with each other.

An application and an operating principle of the anti-parallel diode device 700 may be analogized with reference to the relevant descriptions of the anti-parallel diode device 500 and therefore will not be further described. In the present embodiment, semiconductors 722, 727, and 730 may be collector layers and semiconductors 723, 725, and 728 may be emitter layers of transistors. Compared to diodes D75, D72, and D73 formed by the base and emitter layers (the base-emitter diodes), diodes D76, D74, D71 formed by the base and collector layers (the base-collector diodes) have a lower forward turn-on voltages and a higher reverse breakdown voltages. Diodes D76, D74, D71 and diodes D75, D72, and D73 share the same semiconductors and have different forward and reverse electrical characteristics; therefore, an area consumption in the IC may be reduced, and asymmetric voltage clamping design and asymmetric ESD protection design may be achieved.

Figure 8:
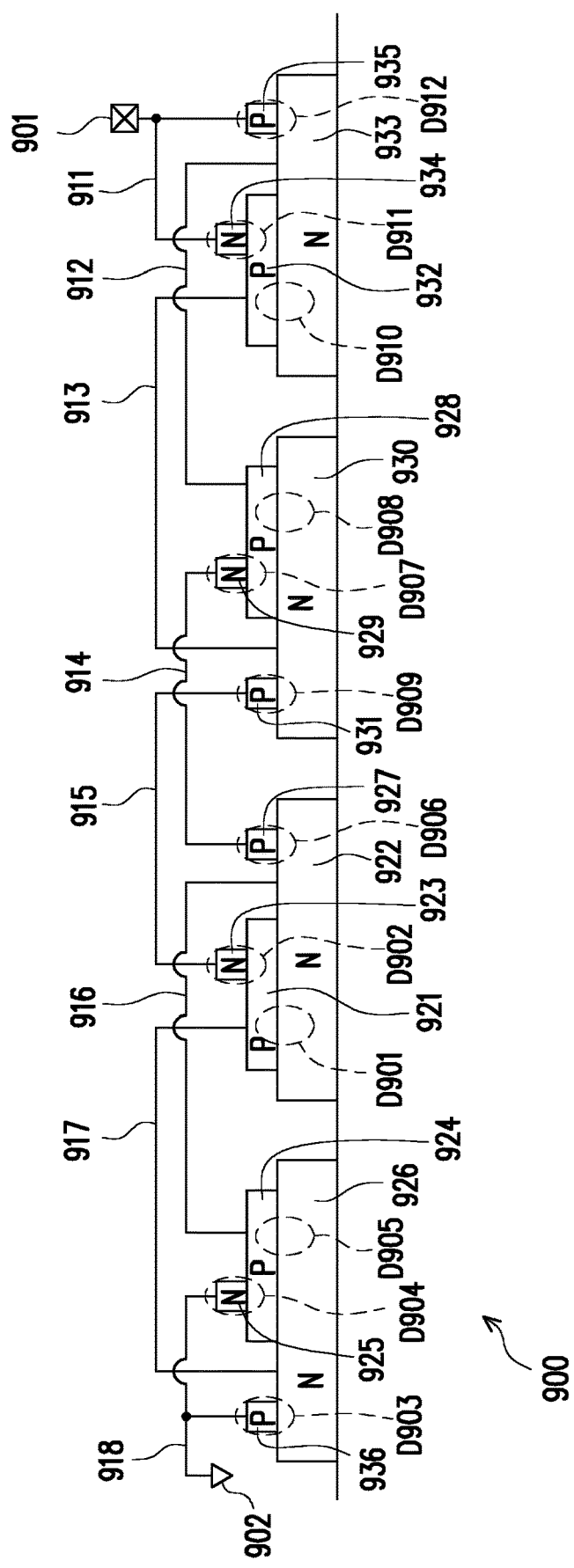
FIG. 8 is a schematic view showing a layout of an anti-parallel diode device according to a fourth embodiment of the invention.

FIG. 8 is a schematic view showing a layout of an anti-parallel diode device 900 according to a fourth embodiment of the invention. The layout shown in FIG. 8 is a cross-sectional view. The anti-parallel diode device 900 includes semiconductors 921-936. Semiconductors 921, 924, 927, 928, 931, 932, 935, and 936 are of a first conductivity type (for example, a P-type), and the semiconductors 922, 923, 925, 926, 929, 930, 933, and 934 are of a second conductivity type (for example, an N-type). In other embodiments, the first conductivity type may be an N-type, and the second conductivity type may be a P-type.

Figure 9:
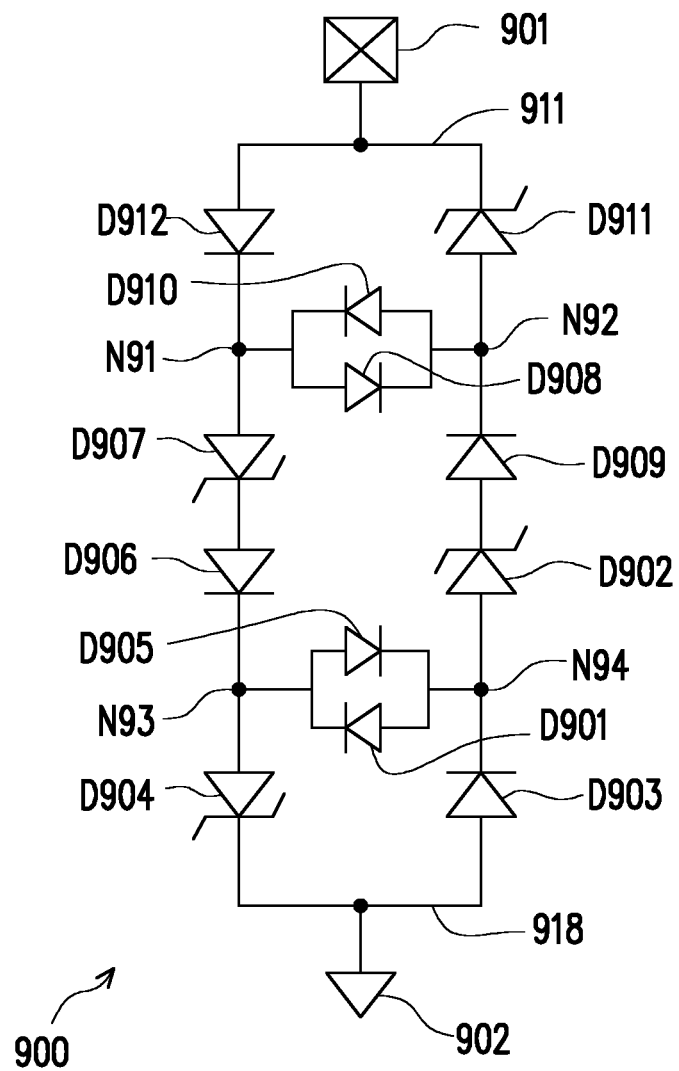
FIG. 9 is a schematic view showing an equivalent circuit of the anti-parallel diode device depicted in FIG. 8 according to an embodiment of the invention.

FIG. 9 is a schematic view showing an equivalent circuit of the anti-parallel diode device 900 depicted in FIG. 8 according to an embodiment of the invention. Please refer to FIG. 8 and FIG. 9. Semiconductors 922-923 are in contact with semiconductor 921 to form diodes D901-D902, respectively. Semiconductor 921 is disposed between semiconductors 922-923 as shown in FIG. 8. Semiconductors 921, 922, and 923 may serve as a base, a collector, and an emitter of a transistor, respectively. Since diodes D901-D902 share the same semiconductor 921, an area consumption in the IC may be reduced.

Semiconductor 927 is placed on and in contact with semiconductor 922 to form diode D906. Since diodes D901 and D906 share the same semiconductor 922, an area consumption in the IC may be reduced.

In the embodiment shown in FIG. 8, semiconductor 936 is placed on and in contact with semiconductor 926 to form diode D903. Semiconductor 924 is in contact with semiconductor 926 to form diode D905. Since diodes D903 and D905 share the same semiconductor 926, an area consumption in the IC may be reduced.

Semiconductor 925 is in contact with semiconductor 924 to form diode D904. Semiconductor 924 is disposed between semiconductors 925 and 926 as shown in FIG. 8. Semiconductors 924, 926, and 925 may serve as a base, a collector, and an emitter of a transistor, respectively. Since diodes D904-D905 share the same semiconductor 924, an area consumption in the IC may be reduced.

A first terminal (e.g., a cathode, i.e., semiconductor conductor 926) of diode D903 is electrically connected to semiconductor 921 (second terminals of diodes D901-D902) via wire 917. A second terminal of diode D903 (e.g., an anode, i.e., semiconductor 936) is electrically connected to a first terminal (e.g., a cathode, i.e., semiconductor 925) of diode D904 via wire 918. A second terminal (e.g., an anode, i.e., semiconductor 924) of diode D905 is electrically connected to semiconductor 922 (first terminals of diodes D901 and D906) via wire 916.

Semiconductors 928 and 931 are placed on and in contact with semiconductor 930 to form diodes D908-D909, respectively. Since diodes D908-D909 share the same semiconductor 930, an area consumption in the IC may be reduced.

Semiconductor 929 is in contact with semiconductor 928 to form diode D907. Semiconductor 928 is disposed between semiconductors 929 and 930 as shown in FIG. 8. Semiconductors 928, 930, and 929 may serve as a base, a collector, and an emitter of a transistor, respectively. Since diodes D907-D908 share the same semiconductor 928, an area consumption in the IC may be reduced.

Semiconductor 931 (an anode of diode D909) is electrically connected to semiconductor 923 (a cathode of diode D902) via wire 915. Semiconductor 929 (an cathode of diode D907) is electrically connected to semiconductor 927 (an anode of diode D906) via wire 914.

Semiconductors 932 and 935 are placed on and in contact with semiconductor 933 to form diodes D910 and D912, respectively. Diodes D912, D907, D906, and D904 form a diode string. Since diodes D910 and D912 share the same semiconductor 933, an area consumption in the IC may be reduced.

Semiconductor 934 is in contact with semiconductor 932 to form diode D911. Diodes D911, D909, D902, and D903 form another diode string. Semiconductor 932 is disposed between semiconductors 933-934 as shown in FIG. 8. Semiconductors 932, 933, and 934 may serve as a base, a collector, and an emitter of a transistor, respectively. Since diodes D910-D911 share the same semiconductor 932, an area consumption in the IC may be reduced.

A first terminal (e.g., a cathode, i.e., semiconductor 933) of diode D912 is electrically connected to semiconductor 928 (second terminals of diodes D907-D908) via wire 912. A second terminal of diode D912 (e.g., an anode, i.e., semiconductor 935) is electrically connected to a first terminal of diode D911 (e.g., a cathode, i.e., semiconductor 934) via wire 911. A second terminal of diode D910 (e.g., an anode, i.e., semiconductor 932) is electrically connected to semiconductor 930 via wire 913 (first terminals of diodes D908-D909). Further, as shown in FIG. 8, semiconductors 924 and 936 disposed on a same surface of semiconductor 926, semiconductors 921 and 927 disposed on a same surface of semiconductor 922, semiconductors 928 and 931 disposed on a same surface of semiconductor 930, and semiconductors 932 and 935 disposed on a same surface of semiconductor 933 may be isolated from each other and may not be in contact with each other. Semiconductors 926, 922, 930, and 933 disposed on the same surface of a substrate may be isolated from each other and may not be in contact with each other.

The anti-parallel diode device 900 may be used for ESD protection circuits, voltage dividers, and voltage clampers of IC, etc. Taking ESD protection of the IC as an example, the anode of diode D912 (semiconductor 935) and the cathode of diode D911 (semiconductor 934) may be electrically connected to pad 901 of the IC via wire 911. The anode of diode D903 (semiconductor 936) and the cathode of diode D904 (semiconductor 925) may be electrically connected to reference voltage 902 of the IC via wire 918. The anti-parallel diode device 900 may perform a voltage clamping function or ESD protection on pad 901.

Pad 901 may transmit signals under normal operating conditions in which no static electricity is generated. When a signal voltage level of pad 901 is higher than a voltage level of reference voltage 902, a voltage difference between pad 901 and reference voltage 902 should be less than a sum of forward turn-on voltages of diodes D912, D907, D906, and D904. When the signal voltage level of pad 901 is lower than the voltage level of reference voltage 902, the voltage difference between pad 901 and reference voltage 902 should be less than a sum of forward turn-on voltages of diodes D911, D909, D902, and D903. Therefore, the anti-parallel diode device 900 does not affect a normal operation of the IC.

When an electrostatic pulse is generated on pad 901, if the electrostatic pulse is positive, an ESD current may flow from pad 901 to reference voltage 902 through wire 911, diode D912, wire 912, diode D907, wire 914, diode D906, wire 916, diode D904, and wire 918. If the electrostatic pulse is negative, a negative ESD current may flow from pad 901 to reference voltage 902 via wire 911, diode D911, wire 913, diode D909, wire 915, diode D902, wire 917, diode D903, and wire 918.

When ESD causes diodes D912, D907, D906, and D904 to be forwardly turned on, and diodes D911, D909, D902, and D903 are in reverse-bias states. Node N91 may provide a dividing-voltage potential to node N92 through diodes D908 and/or D910, and node N93 may provide a dividing-voltage potential to node N94 through diodes D901 and/or D905. Therefore, the anti-parallel diode device 900 may minimize the effect of unbalancing reverse-bias across diodes D911, D909, D902, and D903 to avoid damages to the diodes. An unbalanced cross-voltage problem of diodes D912, D907, D906 and D904 may be analogized with reference to the descriptions of diodes D911, D909, D902, and D903 and therefore will not be described again.

In the present embodiment, semiconductors 926, 922, 930, and 933 may be collector layers and semiconductors 925, 923, 929, and 934 may be emitter layers of the transistors. Compared to diodes D911, D907, D902, and D904 formed by the base and emitter layers (base-emitter diodes), diodes D912, D909, D906, and D903 formed by the base and collector layers (base-collector diodes) in this embodiment have lower forward turn-on voltages and higher reverse breakdown voltages. In this embodiment, the base-emitter diodes and the base-collector diodes are alternately arranged to achieve a symmetrical voltage clamping design and/or a symmetrical ESD design.

In the present embodiment, diodes D911, D907, D902, and D904 and diodes D912, D909, D906, and D903 share the same semiconductors, so as to reduce an area consumption in the IC. In the layout design of the shared semiconductors, the base-collector diodes D908, D910, D905, and D901 provide dividing voltages of the nodes of the forwardly turned-on diode string to the nodes of another diode string in the reverse-bias state, so that the voltage across the diodes in the reverse-bias states is not excessively large, and damages to the diodes may be avoided.

Figure 10:
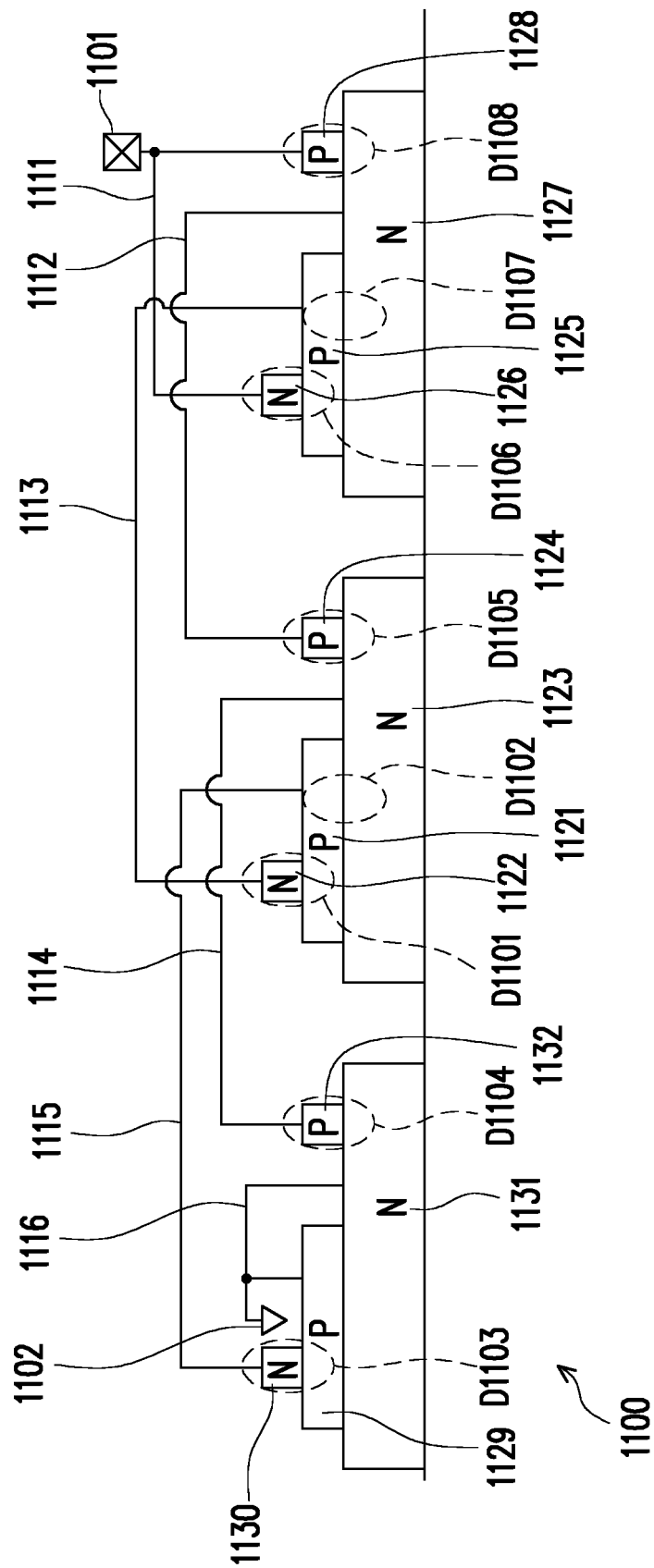
FIG. 10 is a schematic view showing a layout of an anti-parallel diode device according to a fifth embodiment of the invention.

FIG. 10 is a schematic view showing a layout of an anti-parallel diode device 1100 according to a fifth embodiment of the invention. The layout shown in FIG. 10 is a cross-sectional view. The anti-parallel diode device 1100 includes semiconductors 1121 to 1132. In the embodiment shown in FIG. 10, semiconductors 1121, 1124, 1125, 1128, 1129, and 1132 are of a first conductivity type (for example, a P-type), and semiconductors 1122, 1123, 1126, 1127, 1130, and 1131 are of a second conductivity type (for example, an N-type). In other embodiments, the first conductivity type may be an N-type, and the second conductivity type may be a P-type.

Figure 11:
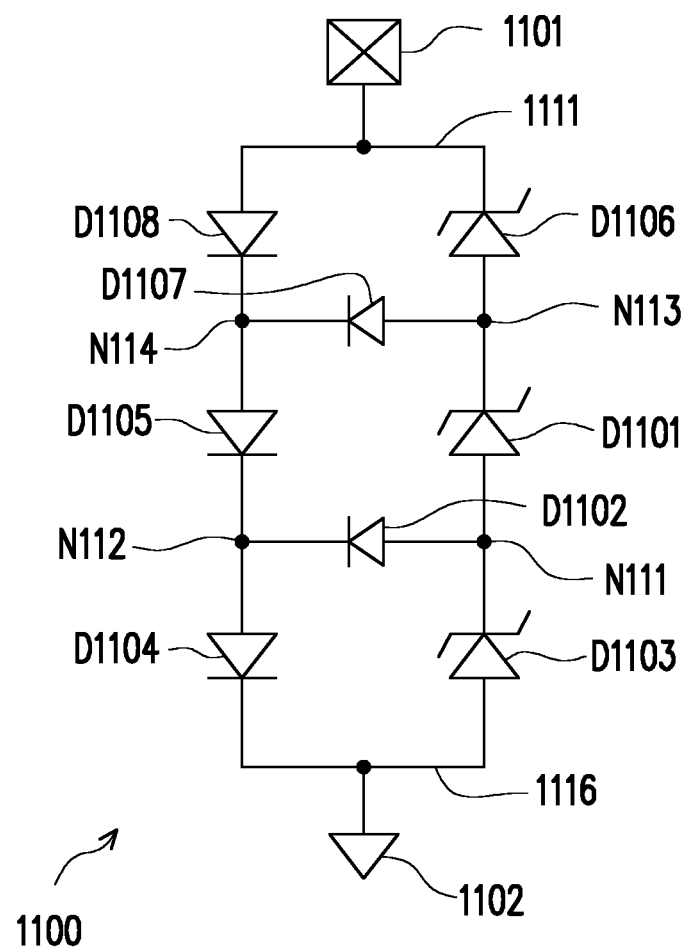
FIG. 11 is a schematic view showing an equivalent circuit of the anti-parallel diode device depicted in FIG. 10 according to an embodiment of the invention.

FIG. 11 is a schematic view showing an equivalent circuit of the anti-parallel diode device 1100 depicted in FIG. 10 according to an embodiment of the invention. Please refer to FIG. 10 and FIG. 11. Semiconductor 1122 and 1123 are in contact with semiconductor 1121 to form diodes D1101-D1102, respectively. Semiconductor 1121 is disposed between semiconductors 1122-1123 as shown in FIG. 10. Semiconductors 1121, 1123, and 1122 may serve as a base, a collector, and an emitter of a transistor, respectively. Since diodes D1101-D1102 share the same semiconductor 1121, an area consumption in the IC may be reduced.

Semiconductor 1124 is placed on and in contact with semiconductor 1123 to form diode D1105. Since diodes D1102 and D1105 share the same semiconductor 1123, an area consumption in IC may be reduced.

In the embodiment shown in FIG. 10, semiconductors 1129 and 1132 are placed on semiconductor 1131. Semiconductor 1132 is in contact with semiconductor 1131 to form diode D1104. Semiconductor 1130 is in contact with semiconductor 1129 to form diode D1103. Semiconductor 1129 is disposed between semiconductors 1130 and 1131 as shown in FIG. 10. Semiconductors 1129, 1131, and 1130 may serve as a base, a collector, and an emitter of a transistor.

A first terminal (e.g., a cathode, i.e., semiconductor 1130) of diode D1103 is electrically connected to semiconductor 1121 (second terminals of diodes D1101-D1102) via wire 1115. A second terminal of diode D1103 (e.g., an anode, i.e., semiconductor 1129) is electrically connected to a first terminal (e.g., a cathode, i.e., semiconductor 1131) of diode D1104 via wire 1116. A second terminal (e.g., an anode, i.e., semiconductor 1132) of diode D1104 is electrically connected to semiconductor 1123 via wire 1114 (first terminals of diodes D1102 and D1105).

Semiconductors 1125 and 1128 are placed on and in contact with semiconductor 1127 to form diodes D1107-D1108, respectively. Diodes D1108, D1105, and D1104 form a diode string. Since diodes D1107-D1108 share the same semiconductor 1127, an area consumption in the IC may be reduced.

Semiconductor 1126 is in contact with semiconductor 1125 to form diode D1106. Diodes D1106, D1101 and D1103 form another diode string. Semiconductor 1125 is disposed between semiconductors 1126 and 1127 as shown in FIG. 10. Semiconductors 1125, 1127, and 1126 may serve as a base, a collector, and an emitter of a transistor, respectively. Since diodes D1106-D1107 share the same semiconductor 1125, an area consumption in the IC may be reduced.

A first terminal (e.g., a cathode, i.e., semiconductor 1126) of diode D1106 is electrically connected to semiconductor 1128 (a second terminal of diode D1108) via wire 1111. Semiconductor 1127 (first terminals of diodes D1107-D1108) is electrically connected to semiconductor 1124 (an anode of diode D1105) via wire 1112. Semiconductor 1125 (second terminals of diodes D1106-D1107) is electrically connected to semiconductor 1122 (a first terminal of diode D1101) via wire 1113. Further, as shown in FIG. 10, semiconductors 1129 and 1132 disposed on a same surface of semiconductor 1131, semiconductors 1121 and 1124 disposed on a same surface of semiconductor 1123, and semiconductors 1125 and 1128 disposed on a same surface of semiconductor 1127 may be isolated from each other and are not in contact with each other. Semiconductors 1131, 1123, and 1127 disposed on the same surface of a substrate may be isolated from each other and are not in contact with each other.

An application and an operating principle of the anti-parallel diode device 1100 under a normal operation in which no static electricity is generated and in a case of an electrostatic pulse is generated may be analogized with reference to the relevant descriptions of the anti-parallel diode devices 500 and 700 and therefore will not be further described. In the present embodiment, when ESD occurs, diodes D1106, D1101, and D1103 are forwardly turned on. Diodes D1108, D1105, and D1104 are in reverse-bias states. Node N111 between diodes D1103 and D1101 may provide a dividing-voltage potential to node N112 between diodes D1104 and D1105 through diode D1102. Node N113 between diodes D1101 and D1106 may provide a dividing-voltage potential to node N114 between diodes D1105 and D1108 through diode D1107. Therefore, the anti-parallel diode device 1100 may minimize the effect of unbalancing voltages across diodes D1104, D1105, and D1108 to avoid damages to diodes D1104, D1105, and D1108.

Figure 12:
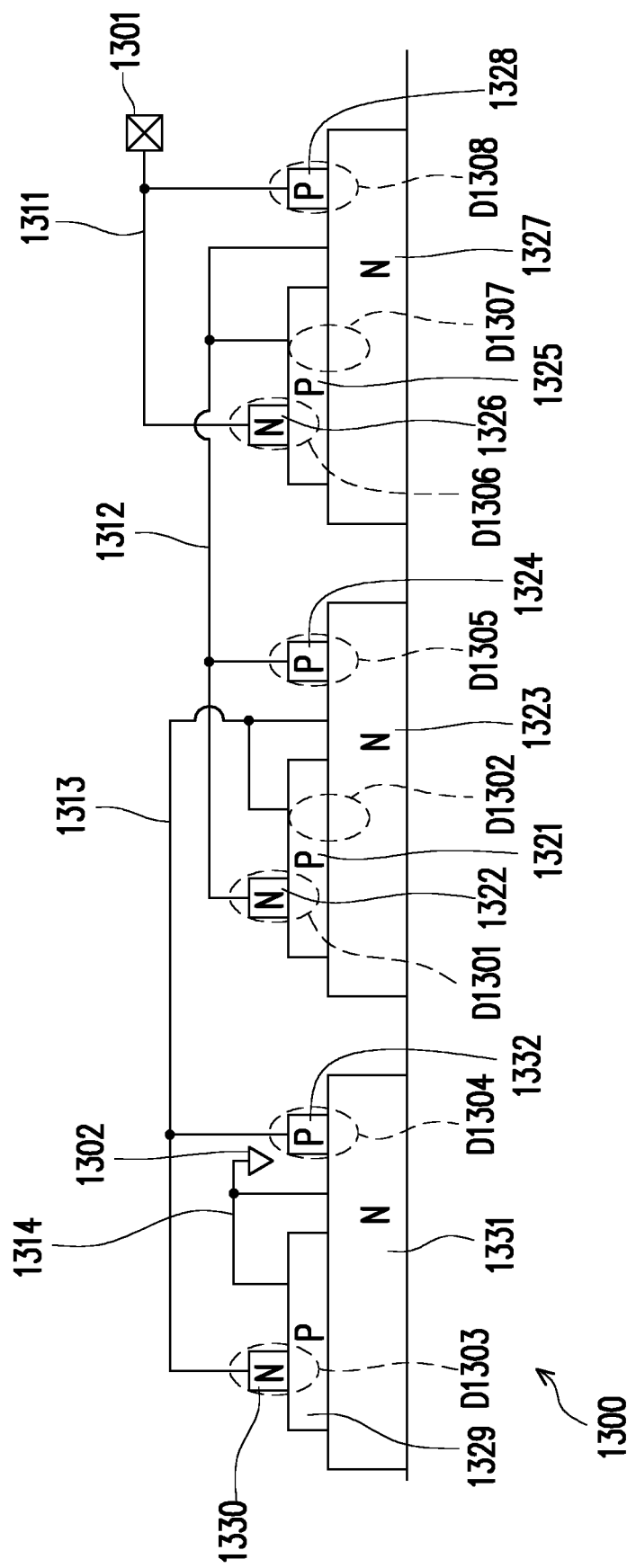
FIG. 12 is a schematic view showing a layout of an anti-parallel diode device according to a sixth embodiment of the invention.

FIG. 12 is a schematic view showing a layout of an anti-parallel diode device 1300 according to a sixth embodiment of the invention. The layout shown in FIG. 12 is a cross-sectional view. The anti-parallel diode device 1300 includes semiconductors 1321 to 1332. In the embodiment shown in FIG. 12, semiconductors 1321, 1324, 1325, 1328, 1329, and 1332 are of a first conductivity type (for example, a P-type), and semiconductors 1322, 1323, 1326, 1327, 1330, and 1331 are of a second conductivity type (for example, an N-type). In other embodiments, the first conductivity type may be an N-type, and the second conductivity type may be a P-type.

Figure 13:
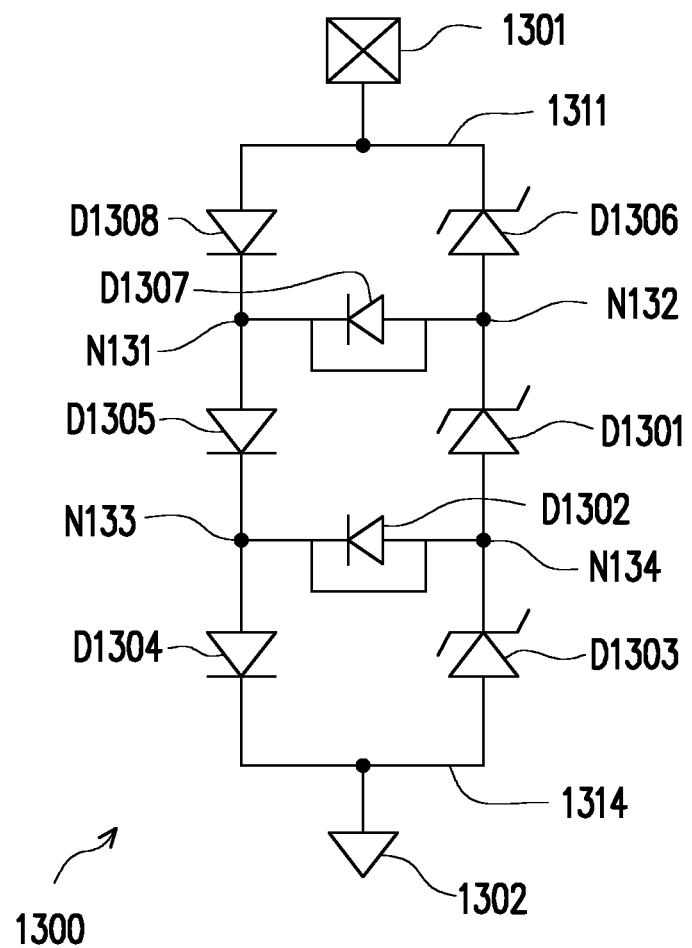
FIG. 13 is a schematic view showing an equivalent circuit of the anti-parallel diode device depicted in FIG. 12 according to an embodiment of the invention.

FIG. 13 is a schematic view showing an equivalent circuit of the anti-parallel diode device 1300 depicted in FIG. 12 according to an embodiment of the invention. Please refer to FIG. 12 and FIG. 13. Semiconductor 1322 and 1323 are in contact with semiconductor 1321 to form diodes D1301-D1302, respectively. Semiconductor 1321 is disposed between semiconductors 1322-1323 as shown in FIG. 12. Semiconductors 1321, 1323, and 1322 may serve as a base, a collector, and an emitter of a transistor, respectively. Since diodes D1301-D1302 share the same semiconductor 1321, an area consumption in the IC may be reduced.

Semiconductor 1324 is placed on and in contact with semiconductor 1323 to form diode D1305. Since diodes D1302 and D1305 share the same semiconductor 1323, an area consumption in the IC may be reduced.

In the embodiment shown in FIG. 12, semiconductors 1329 and 1332 are placed on semiconductor 1331. Semiconductor 1332 is in contact with semiconductor 1331 to form diode D1304. Semiconductor 1330 is in contact with semiconductor 1329 to form diode D1303. Semiconductor 1329 is disposed between semiconductors 1330 and 1331 as shown in FIG. 12. Semiconductors 1329, 1331, and 1330 may serve as a base, a collector, and an emitter of a transistor, respectively.

A first terminal of diode D1303 (e.g., a cathode, i.e., semiconductor 1330) is electrically connected to a second terminal of diode D1304 (e.g., an anode, i.e., semiconductor 1332), second terminals of diodes D1301-D1302 (semiconductor 1321), and first terminals of diodes D1302 and D1305 (semiconductor 1323) via wire 1313. A second terminal of diode D1303 (e.g., an anode, i.e., semiconductor 1329) is electrically connected to a first terminal of diode D1304 (e.g., a cathode, i.e., semiconductor 1331) via wire 1314.

Semiconductors 1325 and 1328 are placed on and in contact with semiconductor 1327 to form diodes D1307-D1308, respectively. Diodes D1308, D1305, and D1304 form a diode string. Since diodes D1307 and D1308 share the same semiconductor 1327, an area consumption in the IC may be reduced.

Semiconductor 1326 is in contact with semiconductor 1325 to form diode D1306. Diodes D1306, D1301, and D1303 form another diode string. Semiconductor 1325 is disposed between semiconductors 1326 and 1327 as shown in FIG. 12. Semiconductors 1325, 1327, and 1326 may serve as a base, a collector, and an emitter of a transistor, respectively. Since diodes D1306-D1307 share the same semiconductor 1325, an area consumption in the IC may be reduced.

A second terminal (e.g., a cathode, i.e., semiconductor 1326) of diode D1306 is electrically connected to a first terminal of diode D1308 (semiconductor 1328) via wire 1311. Semiconductor 1327 (second terminals of diodes D1307-D1308) is electrically connected to semiconductor 1325 (first terminals of diodes D1306-D1307), a first terminal of diode D1305 (e.g., an anode, i.e., semiconductor 1324), and a second terminal of diode D1301 (e.g., a cathode, i.e., semiconductor 1322). Further, as shown in FIG. 12, semiconductors 1329 and 1332 disposed on a same surface of semiconductor 1331, semiconductors 1321 and 1324 disposed on a same surface of semiconductor 1323, and semiconductors 1325 and 1328 disposed on a same surface of semiconductor 1327 may be isolated from each other and are not in contact with each other. Semiconductors 1331, 1323, and 1327, which are disposed on the same surface of a substrate, may be isolated from each other and are not in contact with each other.

An application and an operating of the anti-parallel diode device 1300 under a normal operation in which no static electricity is generated and in a case of an electrostatic pulse is generated may be analogized with reference to the relevant descriptions of the anti-parallel diode devices 500, 700, and 1100 and therefore will not be further described. In the present embodiment, when ESD occurs, diodes D1308, D1305, and D1304 are forwardly turned on, and diodes D1306, D1301 and D1303 are in reverse-bias states. Node N131 between diodes D1308 and D1305 may provide a dividing-voltage potential to node N132 between diodes D1306 and D1301, and node N133 between diodes D1305 and D1304 may provide a dividing-voltage potential to node N134 between diodes D1301 and D1303. Therefore, the anti-parallel diode device 1300 may minimize the effect of unbalancing voltages across diodes D1306, D1301, and D1303 to avoid damages to diodes D1306, D1301, and D1303. An unbalanced cross-voltage problem of diodes D1308, D1305, and D1304 may be analogized with reference to the relevant descriptions of diodes D1306, D1301, and D1303 and therefore will not be further addressed.

The technologies applied in the manufacturing process of the above-described anti-parallel diode devices 300, 500, 700, 900, 1100, and/or 1300 may be determined according to design requirements. For instance, the technologies may be III-V heterojunction bipolar transistor (HBT) technologies, III-V pseudomorphic high electron mobility transistor (PHEMT) technologies, silicon HBT technologies, silicon-germanium (SiGe) HBT technologies, silicon-on-insulator (SOI) technologies, or any other manufacturing technologies.

To sum up, in the anti-parallel diode device provided in one or more embodiments of the invention, when one side of the anti-parallel diodes is forwardly turned on, two terminals of each diode on the other side have clearly defined reverse voltages to avoid reverse breakdown voltages from becoming turn-on voltages, and a layout area is small. Besides, the anti-parallel diode device provided in some embodiments of the invention is equipped with two diode strings. When a first diode string is forwardly turned on, a voltage dividing potential of node of the first diode string can control the voltage across the diodes in a second diode string, and vice versa. Therefore, the anti-parallel diode device may minimize the effect of unbalancing voltages across the diodes. According to one or more embodiments of the invention, the layout design of the shared semiconductor and the diodes composed of different semiconductor layers allows the area occupied by the IC to be reduced and achieves a symmetric or asymmetric voltage clamping design and ESD design.

It will be apparent to those skilled in the art that various modifications and variations can be made to the structure provided herein without departing from the scope or spirit of the invention. In view of the foregoing, it is intended that the disclosure provide modifications and variations provided they fall within the scope of the following claims and their equivalents.

What is claimed is:

1. An anti-parallel diode device comprising:
a first semiconductor, wherein the first semiconductor is of a first conductivity type;
a second semiconductor in contact with the first semiconductor, wherein the second semiconductor is of a second conductivity type, and the first semiconductor and the second semiconductor form a first diode;
a third semiconductor in contact with the first semiconductor, wherein the third semiconductor is of the second conductivity type, and the first semiconductor and the third semiconductor form a second diode, wherein the second semiconductor and the third semiconductor are both disposed on the first semiconductor so that the first diode and the second diode share the first semiconductor without a connection wire between the second semiconductor of the first diode and the third semiconductor of the second diode; and
a third diode having a first terminal electrically connected to the first semiconductor shared by the first diode and the second diode via a first connection wire and having a second terminal electrically connected to the second semiconductor of the first diode via a second connection wire, wherein the first terminal of the third diode is of the second conductivity type and the second terminal of the third diode is of the first conductivity type,
wherein the anti-parallel diode device performs a voltage clamping between a first terminal and a second terminal of the anti-parallel diode device when an electrostatic pulse is generated between the first terminal and the second terminal of the anti-parallel diode device.

2. The anti-parallel diode device according to claim 1, wherein the first conductivity type is an N-type, and the second conductivity type is a P-type.

3. The anti-parallel diode device according to claim 1, wherein the first conductivity type is a P-type, and the second conductivity type is an N-type.

4. The anti-parallel diode device according to claim 1, further comprising:
a fourth diode having a first terminal electrically connected to the first semiconductor, wherein the first terminal of the fourth diode is of the second conductivity type.

5. The anti-parallel diode device according to claim 4, wherein the second semiconductor and the third semiconductor are both disposed on a first surface of the first semiconductor, and the anti-parallel diode device further comprises:
a reference voltage electrically coupled to a second terminal of the third diode and the second semiconductor; and
a pad electrically coupled to a second terminal of the fourth diode and the third semiconductor.

6. The anti-parallel diode device according to claim 4, wherein the second semiconductor and the third semiconductor are both disposed on a first surface of the first semiconductor, and the anti-parallel diode device further comprises:

a fourth semiconductor, wherein the fourth semiconductor is of the first conductivity type, and the fourth semiconductor is electrically connected to the third semiconductor;
a fifth semiconductor in contact with the fourth semiconductor, wherein the fifth semiconductor is of the second conductivity type, the fourth semiconductor and the fifth semiconductor form the fourth diode, and the fifth semiconductor is electrically connected to the first semiconductor;
a sixth semiconductor in contact with the fourth semiconductor, wherein the sixth semiconductor is of the second conductivity type, the fourth semiconductor and the sixth semiconductor form a fifth diode, and the fifth semiconductor and the sixth semiconductor are both disposed on a first surface of the fourth semiconductor; and
a sixth diode having a first terminal electrically connected to the fourth semiconductor, wherein the first terminal of the sixth diode is of the second conductivity type.

7. The anti-parallel diode device according to claim 6, further comprising:
a reference voltage electrically coupled to a second terminal of the third diode and the second semiconductor; and
a pad electrically coupled to a second terminal of the sixth diode and the sixth semiconductor.

8. The anti-parallel diode device according to claim 6, wherein the fifth semiconductor and the sixth semiconductor are both disposed on a second surface of the fourth semiconductor.

9. The anti-parallel diode device according to claim 4, wherein the first semiconductor is disposed between the second semiconductor and the third semiconductor, and the anti-parallel diode device further comprises:
a fourth semiconductor, wherein the fourth semiconductor is of the first conductivity type, and the fourth semiconductor is electrically connected to the third semiconductor;
a fifth semiconductor in contact with the fourth semiconductor, wherein the fifth semiconductor is of the second conductivity type, the fourth semiconductor and the fifth semiconductor form the fourth diode, and the fifth semiconductor is electrically connected to the first semiconductor;
a sixth semiconductor in contact with the fourth semiconductor, wherein the sixth semiconductor is of the second conductivity type, the fourth semiconductor and the sixth semiconductor form a fifth diode, and the fourth semiconductor is disposed between the fifth semiconductor and the sixth semiconductor; and
a sixth diode having a first terminal electrically connected to the fourth semiconductor, wherein the first terminal of the sixth diode is of the second conductivity type.

10. The anti-parallel diode device according to claim 9, further comprising:
a reference voltage electrically coupled to a second terminal of the third diode and the second semiconductor; and
a pad electrically coupled to a second terminal of the sixth diode and the sixth semiconductor.

11. The anti-parallel diode device according to claim 9, wherein the first semiconductor is a base of a transistor, the second semiconductor is a collector of the transistor, and the third semiconductor is an emitter of the transistor.

12. The anti-parallel diode device according to claim 1, wherein the first semiconductor is disposed between the second semiconductor and the third semiconductor, and the anti-parallel diode device further comprises:

a fourth semiconductor, wherein the fourth semiconductor is of the first conductivity type, and the fourth semiconductor is electrically connected to the second semiconductor;

a fifth semiconductor in contact with the fourth semiconductor, wherein the fifth semiconductor is of the second conductivity type, and the fourth semiconductor and the fifth semiconductor form a fourth diode;

a sixth semiconductor in contact with the fourth semiconductor, wherein the sixth semiconductor is of the second conductivity type, the fourth semiconductor and the sixth semiconductor form a fifth diode, the fourth semiconductor is disposed between the fifth semiconductor and the sixth semiconductor, and the sixth semiconductor is electrically connected to the first semiconductor;

a seventh semiconductor in contact with the second semiconductor, wherein the seventh semiconductor is of the first conductivity type, and the second semiconductor and the seventh semiconductor form a sixth diode;

an eighth semiconductor, wherein the eighth semiconductor is of the first conductivity type;

a ninth semiconductor in contact with the eighth semiconductor, wherein the ninth semiconductor is of the second conductivity type, the eighth semiconductor and the ninth semiconductor form a seventh diode, and the ninth semiconductor is electrically connected to the seventh semiconductor;

a tenth semiconductor in contact with the eighth semiconductor, wherein the tenth semiconductor is of the second conductivity type, the eighth semiconductor and the tenth semiconductor form an eighth diode, and the eighth semiconductor is disposed between the ninth semiconductor and the tenth semiconductor;

an eleventh semiconductor in contact with the tenth semiconductor, wherein the eleventh semiconductor is of the first conductivity type, the eleventh semiconductor is electrically connected to the third semiconductor, and the tenth semiconductor and the eleventh semiconductor form a ninth diode;

a twelfth semiconductor, wherein the twelfth semiconductor is of the first conductivity type, and the twelfth semiconductor is electrically connected to the tenth semiconductor;

a thirteenth semiconductor in contact with the twelfth semiconductor, wherein the thirteenth semiconductor is of the second conductivity type, the twelfth semiconductor and the thirteenth semiconductor form a tenth diode, and the thirteenth semiconductor is electrically connected to the eighth semiconductor;

a fourteenth semiconductor in contact with the twelfth semiconductor, wherein the fourteenth semiconductor is of the second conductivity type, the twelfth semiconductor and the fourteenth semiconductor form an eleventh diode, and the twelfth semiconductor is disposed between the thirteenth semiconductor and the fourteenth semiconductor; and a twelfth diode having a first terminal electrically connected to the eighth semiconductor, wherein the first terminal of the twelfth diode is of the second conductivity type.

13. The anti-parallel diode device according to claim 12, further comprising:

a reference voltage electrically coupled to a second terminal of the third diode and the fifth semiconductor; and a pad electrically coupled to a second terminal of the twelfth diode and the fourteenth semiconductor.

14. The anti-parallel diode device according to claim 12, wherein the first semiconductor is a base of a transistor, the second semiconductor is a collector of the transistor, and the third semiconductor is an emitter of the transistor.

15. The anti-parallel diode device according to claim 1, wherein the first semiconductor is disposed between the second semiconductor and the third semiconductor, and the anti-parallel diode device further comprises:

a fourth diode, wherein a first terminal of the fourth diode is of the second conductivity type, and a second terminal of the fourth diode is electrically connected to the third semiconductor;

a fourth semiconductor in contact with the third semiconductor, wherein the fourth semiconductor is of the first conductivity type, and the third semiconductor and the fourth semiconductor form a fifth diode;

a fifth semiconductor, wherein the fifth semiconductor is of the first conductivity type, and the fifth semiconductor is electrically connected to the second semiconductor;

a sixth semiconductor in contact with the fifth semiconductor, wherein the sixth semiconductor is of the second conductivity type, and the fifth semiconductor and the sixth semiconductor form a sixth diode;

a seventh semiconductor in contact with the fifth semiconductor, wherein the seventh semiconductor is of the second conductivity type, the fifth semiconductor and the seventh semiconductor form a seventh diode, the fifth semiconductor is disposed between the sixth semiconductor and the seventh semiconductor, and the seventh semiconductor is electrically connected to the fourth semiconductor; and an eighth diode having a first terminal electrically connected to the fourth semiconductor, wherein the first terminal of the eighth diode is of the second conductivity type.

16. The anti-parallel diode device according to claim 15, further comprising:

a reference voltage electrically coupled to a second terminal of the third diode and the first terminal of the fourth diode; and a pad electrically coupled to a second terminal of the eighth diode and the sixth semiconductor.

17. The anti-parallel diode device according to claim 15, wherein the first semiconductor is a base of a transistor, the second semiconductor is an emitter of the transistor, and the third semiconductor is a collector of the transistor.

18. The anti-parallel diode device according to claim 1, wherein the first semiconductor is disposed between the second semiconductor and the third semiconductor, and the anti-parallel diode device further comprises:

a fourth diode, wherein a first terminal of the fourth diode is of the second conductivity type, and a second terminal of the fourth diode is electrically connected to the first semiconductor and the third semiconductor;

a fourth semiconductor in contact with the third semiconductor, wherein the fourth semiconductor is of the first conductivity type, the fourth semiconductor is electrically connected to the second semiconductor, and the third semiconductor and the fourth semiconductor form a fifth diode;

a fifth semiconductor, wherein the fifth semiconductor is of the first conductivity type, and the fifth semiconductor is electrically connected to the second semiconductor and the fourth semiconductor;

a sixth semiconductor in contact with the fifth semiconductor, wherein the sixth semiconductor is of the second conductivity type, and the fifth semiconductor and the sixth semiconductor form a sixth diode;

a seventh semiconductor in contact with the fifth semiconductor, wherein the seventh semiconductor is of the second conductivity type, the fifth semiconductor and the seventh semiconductor form a seventh diode, the fifth semiconductor is disposed between the sixth semiconductor and the seventh semiconductor, and the seventh semiconductor is electrically connected to the second semiconductor and the fourth semiconductor; and an eighth diode having a first terminal electrically connected to the second semiconductor and the fourth semiconductor, wherein the first terminal of the eighth diode is of the second conductivity type.

19. The anti-parallel diode device according to claim 18, further comprising:

a reference voltage electrically coupled to a second terminal of the third diode and the first terminal of the fourth diode; and a pad electrically coupled to a second terminal of the eighth diode and the sixth semiconductor.

20. The anti-parallel diode device according to claim 1, wherein the anti-parallel diode device adopts a III-V heterojunction bipolar transistor technology, a III-V pseudomorphic high electron mobility transistor technology, a silicon heterojunction bipolar transistor technology, a silicon-germanium heterojunction bipolar transistor technology, or a silicon-on-insulator technology.

* * * * *